United States Patent [19]
Gesing et al.
[11] 3,867,203
[45] Feb. 18, 1975

[54] METHOD FOR PRODUCING SEMICONDUCTOR DEVICES

[75] Inventors: Horst Gesing; Rigobert Schimmer; Manfred Streit, all of Belecke, Germany

[73] Assignee: Licentia Patent-Verwaltungs-G.m.b.H., Frankfurt am Main, Germany

[22] Filed: June 25, 1973

[21] Appl. No.: 373,274

[30] Foreign Application Priority Data

June 23, 1972 Germany .............. 2230749

[52] U.S. Cl. .............. 148/187, 148/190
[51] Int. Cl. .............. H01l 7/44
[58] Field of Search .............. 148/187, 190

[56] References Cited

UNITED STATES PATENTS 3,109,760 11/1963 Gdetzberger .............. 148/186
3,484,313 12/1969 Tauchi et al. .............. 148/187

*Primary Examiner*—L. Dewayne Rutledge
*Assistant Examiner*—J. M. Davis
*Attorney, Agent, or Firm*—Spencer & Kaye

[57] ABSTRACT

Semiconductor devices are produced by simultaneously diffusing into a semiconductor body of two doping substances, one of which produces therein p-type conductivity and the other substance produces n-type conductivity, these substances having different diffusion speeds in said body and different permeabilities in masking layers, one of said doping substances also serving to inhibit diffusion of the other doping substance in the semiconductor body. This provides for close control of the depth and concentration of the doped layers and the resulting semiconductor devices are particularly adopted for preparation of high-frequency components in a subsequent gold-diffusion step.

25 Claims, 4 Drawing Figures

METHOD FOR PRODUCING SEMICONDUCTOR DEVICES

BACKGROUND OF THE INVENTION

The present invention relates to a method for producing semiconductor devices, particularly fast-switching thyristors with integrated diodes, employing doping materials which have various diffusion speeds to simultaneously produce p-type and n-type conductivity regions together with diffusion-inhibiting layers which have varying permeability for the doping materials.

Various methods are known from literature and practice which relates to the diffusion of the elements of Group III and V of the Periodic Table into a silicon substrate and in which the various diffusion speeds of the doping materials are utilized as well as the varying permeability of masking layers with respect to the diffusing substances. Such procedures include the simultaneous diffusion of substances producing n-type as well as p-type conductivity regions as well as the simultaneous diffusion of a plurality of substances producing the same conductivity type.

These known methods have the disadvantage that they usually require a large number of processing steps and, because of fluctuations in the extent of diffusion during the individual consecutive steps, the properties of the finished product frequently deviate markedly from the intended and required values. This lack of effective control during the manufacturing operations accounts for considerable rejection of substandard products with consequent waste of materials and time of workers and equipment.

SUMMARY OF THE INVENTION

The present invention provides for the production of semiconductor devices, such as thyristors for example, simply and economically with relatively few process steps as compared with methods heretofore in use.

It is an object of the method presented here to avoid the difficulties of prior procedures so that high-quality devices and certain complicated structures can be manufactured in a few process steps which can be effectively controlled during production at low costs and wherein the slight fluctuations which are unavoidable can be substantially compensated for in subsequent process steps so that the final variations remaining from the individual process steps are minimal and have practically no effect on the properties of the finished product.

It is a further object of this invention to so control the diffusion of the doping substances within a given charge that marked fluctuations in diffusion parameters for a subsequent gold diffusion are avoided.

This is accomplished according to the present invention in that in a method for producing semiconductor devices in which the doping substances which simultaneously produce p-type and n-type conductivity have different diffusion speeds and in which the diffusion-inhibiting layers have a different permeability for the doping substances whereby the concentration dependence of the diffusion speed as well as the mutual influence of the simultaneously diffused substances which produce different types of conductivity are utilized so that the diffusion of one doping substance is inhibited by the simultaneous presence of the other doping substance.

This can be accomplished, for example, according to the preferred embodiment of the invention by the simultaneous diffusion of gallium and phosphorus, particularly in the form of gallium phosphide, under the conditions to be described in detail below.

With the use of the above-mentioned doping substances and the method to be described in detail below, it is possible to produce favorable starting conditions for a possibly subsequently required gold diffusion particularly if high frequency devices are to be produced. Since such a gold diffusion reacts very sensitively to slight fluctuations in the diffusion result of prior diffusions of other substances, which — if such fluctuations are present — leads to a wide spread in the frequency-sensitive parameters of the devices, such fluctuations must be avoided in the interest of economical fabrication of high-quality components suited for higher frequencies or defined switching processes. Moreover, large fluctuations of the diffusion parameters occur within a given charge, fine corrections by changes in the gold diffusion conditions are practically impossible. The present invention thus provides a method of eliminating such large fluctuations and, moreover, according to a further feature thereof provides the conditions for such a subsequent gold diffusion.

DESCRIPTION OF THE PREFERRED EMBODIMENTS

Figure 1:
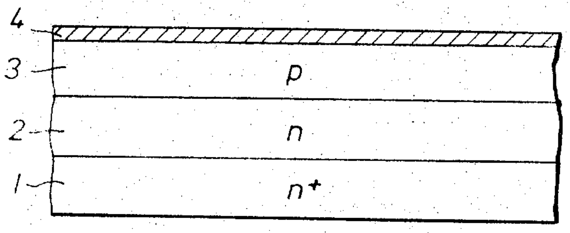
FIG. 1 shows in cross section a semiconductor wafer after a first diffusion according to the invention with a masking layer on only one surface.

Referring now to the figures, the method according to the invention will now be described for a simple semiconductor component, i.e., a diode, and for a complicated component, i.e., a thyristor with an integrated diode.

In producing semiconductor devices according to the invention it has been found desirable to use as the semiconductor material a silicon wafer, e.g., of n-type conductivity which on its surface carries a dense and thick oxide layer as is produced, for example, by 16 hours of exposure to moist oxygen at a temperature of about 1,200°C. Thereafter, the oxide is removed from the silicon wafer on one side thereof by etching with hydrofluoric acid or solutions containing hydrofluoric acid. To produce the layer sequence shown in FIG. 1, according to the invention the n-type conductivity wafer with the oxide layer 4 on one surface thereof is then subjected to a diffusion treatment wherein two different diffusible doping substances which produce opposite conductivity types, respectively, which have different diffusion speeds, and for which the masking layers have different permeabilities, are simultaneously diffused. Preferably the two different doping substances are gallium and phosphorus, e.g., in the form of gallium phosphide and the simultaneous diffusion takes place in a closed quartz ampule for a period of about 30 hours at a temperature of about 1250°C. In the quartz ampule argon is used as a carrier gas under a partial pressure of 170 Torr. The doping substances, in the form of a gallium phosphide powder, are placed in a quartz boat. Simultaneous diffusion is accomplished by evaporating the gallium phosphide powder. As simultaneous diffusion takes place a surface concentration which depends upon the partial vapor pressures of the doping substances Ga and P will be established in the p-conductive layer 3 (6) and in the $n^+$-conductive layer 1 respectively. As an example, about 800 mg gallium phosphide powder may suffice for carrying out, in a first step, such a simultaneous diffusion with a typical charge containing about 200 wafers each having a diameter of approximately 30 mm. Following this diffusion step, the wafers exhibit a dopant surface concentration of about $4.5 \cdot 10^{18}$ atoms/cm$^3$ in the p-conductive layer 3 (6) and a dopant surface concentration being higher than $10^{21}$ atoms/cm$^3$ in the $n^+$-conductive layer 1. The oxide layer 4 (5) has a thickness of preferably 10,000 to 20,000 A for masking the phosphorus effectively.

Following the treatment of the silicon wafer there is as shown in FIG. 1, a diode including a highly doped layer 1 of $n^+$-type conductivity followed by an also n-conductive base layer 2, a p-conductive layer 3 and the oxide layer 4. The layer thickness of the $n^+$-conductive layer 1 is about 40 to 60 $\mu$m, the layer thickness of the p-conductive layer 3 is about 50 to 70 $\mu$m. The thickness of the n-conductive layer 2 therebetween depends on the thickness of the starting material.

It is, of course, understood that a p-conductive starting material may similarly be utilized.

Figure 2:
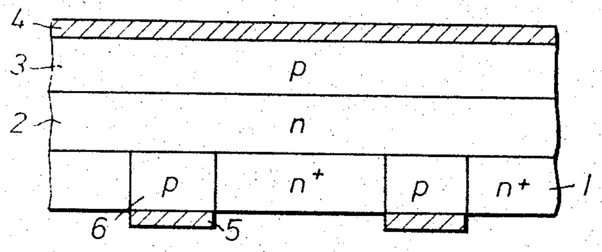
FIGS. 2 and 3 are cross-sectional views of semiconductor wafers following a single diffusion according to the method of the invention with a masking layer on one surface and a partial masking layer on the opposite surface.

If the oxide layer is not removed from the entire side of the semiconductor wafer but left standing in partial regions, e.g., the partial regions 5, the sequence of p, n and $n^+$-conductive layers shown in FIG. 2 results from the single diffusion step mentioned above. In this figure, layers 2, 3 and 4 correspond to the like-numbered layers of FIG. 1. Below the partial regions 5 of the oxide layer, which were not removed from the semiconductor surface during the etching process, there then exist regions 6 of p-type conductivity, in the same layer as the $n^+$-conductive regions 1.

If instead of the simple diode of FIG. 1, a more complicated structure is desired, e.g., a thyristor with integrated diode, such may be produced simply by means of two successive diffusion steps according to the invention.

Figure 3:
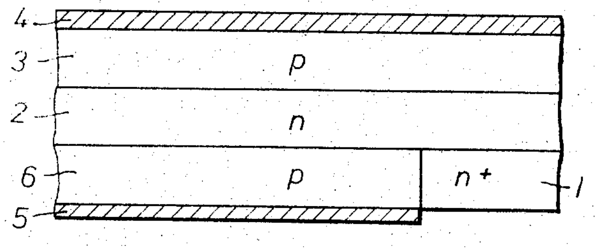

To produce such a structure, as shown in FIG. 3, only a selected portion of the oxide layer 5 is removed from an oxide-coated silicon wafer by a conventional technique of masking and etching with hydrofluoric acid or solutions containing hydrofluoric acid. Thereafter the wafer with the oxide layer 4 and the partial oxide layer 5 are subjected to simultaneous diffusion of gallium and phosphorus in a closed quartz ampule during a time of about 8 to 15 hours, preferably 12 hours, at a temperature of about 1,250°C. The product of this first diffusion step is shown in FIG. 3, wherein the oxide masking layers 4 and 5 correspond to those in FIG. 2, and the various conductive layers and regions are represented by like numerals in both figures.

Figure 4:
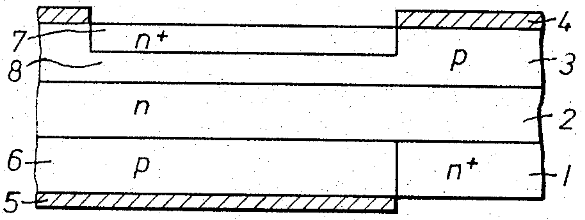
FIG. 4 is a cross section of the semiconductor wafer of FIG. 3 after a second diffusion according to the present invention.

To produce the thyristor with an integrated diode shown in FIG. 4, the oxide layer 4 overlying p-conductive layer 3 of FIG. 3 is partially removed, as shown in FIG. 4, and the wafer is thereafter subjected to a second diffusion step for about 8 to 15 hours, preferably 13 hours, at a temperature of about 1,250°C with gallium and phosphorus. Following this second diffusion, there is obtained the sequence of layers and regions as shown in FIG. 4, wherein there is a $n^+$-conductive cathode region 7 diffused above region 8 in a p-conductive layer 3.

Following the first diffusion, the p-conductive layers 3 and 6 disposed below the oxide layers 4 and 5 have an impurity (dopant) concentration in the order of $(3.5 - 5.0) \times 10^{18}$ atoms/cm$^3$, preferably about $4.5 \times 10^{18}$ atoms/cm$^3$ which is very homogeneous throughout the entire charge in the quartz ampule and the thicknesses of these layers are about 38 to 42 $\mu$m, preferably 40 $\mu$m.

Depending upon the concentration and penetration depth of the doping materials in p-conductive layers following this first diffusion there is a further diffusion thereof during the second diffusing step by about one-half of the penetration depth of the first diffusion and the layer combination shown in FIG. 4 results. The individual layer thicknesses are here 30 $\mu$m for layer 7, 25 $\mu$m for the p-conductive layer 8, 85 $\mu$m for the n-conductive layer 2 and 60 $\mu$m for each of p-conductive layers 3 and 6.

Depending upon the further diffusion and penetration of the gallium, the dopant concentration in the layers as identified above is not markedly varied following this second diffusion step, not even the dopant concentration in the $n^+$-conductive layer 1, but the dopant concentration in the $n^+$-conductive layer 7 is higher than $10^{21}$ atoms/cm$^3$. The diffusion conditions of the second diffusion step are, as will be seen from the foregoing, except the diffusion time, the same as of the first diffusion step.

When the diffusion results vary from the above-indicated desired values after the first diffusion, it is possible to compensate substantially for such deviations during the second diffusion in which the same combination of doping substances is used. If, for example, the penetration depth and/or the impurity concentration in the p-conductive layer is too high, which could happen through slight deviations in temperature and time, an extension in the diffusion time in the second step would produce a compensation which would in the end result produce devices which have uniform dynamic characteristics. Although this process has an extraordinarily narrow spread, in the high frequency parameters of the produced devices, it should be noted that this spread is greater from charge to charge than within any charge.

A typical charge for the above-mentioned method contains about 200 wafers having a diameter of approximately 30 mm. Charges of this size and greater are required in the fabrication of power semiconductors because in contradistinction to the low voltage electronic art, fewer elements are produced per wafer.

Since this method in its final result furnishes extraordinarily accurate and reproduceable diffusion results, it also provides ideal starting conditions for the gold diffusion which is strongly dependent on the diffusion results, as is well known, semiconductor devices for use with high frequencies must be so treated.

For this gold diffusion the wafers coming from the second gallium phosphide diffusion are treated for approximately 5 minutes with an appproximately 40% hydrofluoric acid solution in order to remove the oxide layers. Thereafter, by a cementation process, a gold layer is uniformly deposited over the entire wafer by precipitating same from a gold solution containing approximately $1\times10^{-8}$ to $1\times10^{-3}$, preferably $1\times10^{-4}$ percent by weight gold in 1.5 normal hydroflouric acid. Thereafter, the gold is diffused in for a period of about 1 hour at a temperature between 800° and 950°C preferably between 870° and 875°C.

The gold diffusion procedure as described above is also carried out for producing fast switching diodes and thyristors. This requires that the finished semiconductor device, for instance a thyristor, has a short turn-off time. For a turn-off time given in an extent, the temperature at which gold diffusion must take place is a linear function of the dopant concentration in the p-conductive layers 3 (8) and 6. Specifically, for a turn-off time of 4/us in a thyristor as shown in FIGS. 2 and 4 with dopant concentrations of $3\cdot10^{18}$ atoms/cm$^3$ and $5.5\cdot10^{18}$ atoms/cm$^3$ the gold diffusion temperature must be 880°C and 860°C respectively. Since the dopant concentration in the $n^+$-conductive layer is very high ($>10^{21}$ atoms/cm$^3$), gold diffusion temperature is not in a relation to the dopant concentration.

In devices which must meet many different demands regarding carrier life and reactions in various directions it may still be necessary, particularly when the tolerance range for these requirements is very narrow, as in the thyristor with integrated diode described above, to correct the gold diffusion temperature by way of test and experiment in spite of the high uniformity of the charges resulting from the method of the present invention. This is feasible in respect of the instant invention only because the fluctuation within a given charge is very slight. Accordingly, the experiment furnishes a true result applicable to the entire charge so that it becomes possible to perform valid tests for other influential values, such as for example, the crystal dependency.

It will be understood that the above description of the present invention is susceptible to various modifications, changes, and adapations, and the same are intended to be comprehended within the meaning and range of equivalents of the appended claims.

We claim:

1. A method for producing a semiconductor device comprising the steps of:

providing a wafer of semiconductor material;

providing first and second diffusible doping substances which have different diffusion speeds and which produce one conductivity type and the opposite conductivity type, respectively, and with said second doping substance being a substance which inhibits the diffusion of said first doping substance into the material of said wafer;

applying a masking layer which has a different permeability for each of said first and second diffusible doping substances to a portion of the surface of said wafer;

simultaneously forming a region of only said one conductivity type beneath said masking layer and a region of only said opposite conductivity beneath the unmasked portion of the surface of said wafer by exposing said masked wafer simultaneously to said first and second diffusible doping substances under an elevated temperature and for a time sufficient to diffuse said first doping substances into said wafer through said masking layer, and to diffuse said second doping substance into said wafer at unmasked portions thereof, whereby said masking layer acts as an effective diffusion mask for said second doping substance and said second doping substance serves as a masking substance to inhibit diffusion of said first doping substance into said wafer at said unmasked portions.

2. A method as defined in claim 1 wherein the semiconductor wafer is composed of silicon.

3. A method as defined in claim 2 wherein the first and second doping substances are gallium and phosphorus.

4. A method as defined in claim 3 wherein said first and second doping substances are provided in the form of gallium phosphide.

5. A method as defined in claim 4 wherein the masking layer is silicon oxide.

6. A method as defined in claim 2 wherein the masking layer is silicon dioxide and wherein said second diffusible doping substance is simultaneously used as a masking layer for said first diffusible doping substance.

7. A method as defined in claim 6 wherein said first and second diffusible doping substances are gallium and phosphorus respectively and wherein the masking substance for gallium is phosphorus.

8. A method as defined in claim 7 wherein said step of applying a masking layer includes: oxidizing the surface of the silicon wafer to form a silicon oxide layer; and removing at least a portion of the silicon oxide layer from one side of the oxidized wafer.

9. A method as defined in claim 8 wherein all of the silicon oxide layer is removed from one side of the oxidized wafer and a diode structure is produced therefrom in a single diffusion step.

10. A method as defined in claim 9 wherein the oxide layer is removed by etching with hydrofluoric acid or a solution thereof, and the diffusion step is conducted in a quartz ampule for a period of about 30 hours at a temperature of about 1,250°C.

11. A method as defined in claim 9 wherein: said semiconductor wafer is initially of one conductivity type, a portion of the silicon oxide layer is removed from said one side of the oxidized wafer, and the thus-prepared wafer is subjected to a first simultaneous diffusion of said first and second diffusible doping substances; and further comprising: following said first diffusion, removing a selected portion of the silicon oxide from the opposite side of the wafer and subjecting the wafer to a second diffusion with the doping substances used for the first diffusion.

12. A method as defined in claim 11 wherein the first diffusion takes place for a period of about 8 to 15 hours at a temperature of about 1,250°C.

13. A method as defined in claim 12 wherein the first diffusion takes place during a period of 12 hours at a temperature of about 1,250°C.

14. A method as defined in claim 12 wherein the second diffusion takes place during a period of about 8 to 15 hours at a temperature of about 1,250°C.

15. A method as defined in claim 14 wherein the second diffusion takes place during a period of 13 hours at a temperature of about 1,250°C.

16. A method as defined in claim 12 wherein excessive deviations from predetermined standards following the first diffusion step are compensated for during the second diffusion step.

17. A method as defined in claim 12 wherein the portions of the silicon dioxide layers removed are so selected that a thyristor with an integrated diode is produced by the first and second diffusion steps.

18. A method as defined in claim 12 further comprising diffusing gold into the semiconductor wafer in a third diffusion step thereby producing a component suitable for higher frequencies.

19. A method as defined in claim 18 wherein the gold for the gold diffusion is precipitated from a solution containing hydrofluoric acid directly upon the semiconductor device.

20. A method as defined in claim 19 wherein the gold is precipitated from a solution containing 1.5 normal hydrofluoric acid and approximately $1 \times 10^{-8}$ to $1 \times 10^{-3}$ percent by weight of gold.

21. A method as defined in claim 20 wherein the gold for the gold diffusion is precipitated from a solution containing 1.5 normal hydrofluoric acid and approximately $1 \times 10^{-4}$ percent by weight of gold.

22. A method as defined in claim 19 wherein the gold diffusion is effected for a period of approximately 1 hour at a temperature of 800° to 950°C.

23. A method as defined in claim 22 wherein the gold diffusion is effected for a period of approximately 1 hour at a temperature of 860° to 890°C.

24. A method as defined in claim 23 wherein the gold diffusion takes place during a period of approximately 1 hour at a temperature of 870° to 875°C.

25. A method as defined in claim 22 wherein for a charge of wafers which have been subjected to a first and a second dopant diffusion, the gold diffusion temperature is corrected by way of test with a few wafers of said charge.

* * * * *